United States Patent
Zheng et al.

[19]

[11] Patent Number: 6,144,610
[45] Date of Patent: Nov. 7, 2000

[54] DISTRIBUTED CIRCUITS TO TURN OFF WORD LINES IN A MEMORY ARRAY

[75] Inventors: Hua Zheng, Fremont; Kamin Fei, Sunnyvale, both of Calif.

[73] Assignee: Winbond Electronics Corporation, Hsin Chu, Taiwan

[21] Appl. No.: 09/294,512

[22] Filed: Apr. 20, 1999

[51] Int. Cl.[7] .................................................. G11C 7/00
[52] U.S. Cl. .............................. 365/230.06; 365/230.01; 365/204; 365/203
[58] Field of Search ....................... 365/230.06, 230.01, 365/230.03, 189.01, 189.05, 205, 189.07

[56] References Cited

U.S. PATENT DOCUMENTS

| | | | |
|---|---|---|---|
| 4,695,981 | 9/1987 | Sikich et al. | 365/227 |
| 4,747,083 | 5/1988 | Nakajima et al. | 365/230 |
| 4,899,315 | 2/1990 | Houston | 365/230.06 |
| 4,918,662 | 4/1990 | Kondo | 365/210 |
| 5,295,116 | 3/1994 | Iwashita | 365/230.06 |
| 5,490,119 | 2/1996 | Sakurai et al. | 365/230.08 |
| 5,717,645 | 2/1998 | Kengeri et al. | 365/230.01 |
| 5,761,135 | 6/1998 | Lee | 365/189.11 |
| 5,781,497 | 7/1998 | Patel et al. | 365/230.06 |
| 5,796,664 | 8/1998 | Tsuruda et al. | 365/200 |
| 5,808,955 | 9/1998 | Hwang et al. | 365/230.06 |
| 5,812,483 | 9/1998 | Jeon et al. | 365/230.06 |
| 5,822,253 | 10/1998 | Lines | 365/189.11 |
| 5,835,439 | 11/1998 | Suh | 365/230.06 |
| 5,862,098 | 1/1999 | Jeong | 365/230.06 |
| 5,875,149 | 2/1999 | Oh et al. | 365/230.06 |
| 5,896,345 | 4/1999 | Sohn | 365/230.06 |

*Primary Examiner*—Viet Q. Nguyen
*Attorney, Agent, or Firm*—Dinh & Associates

[57] ABSTRACT

A memory device that includes a row decoder, a set of word line, and one or more word line pull-down drivers. The row decoder includes decoding circuitry and a set of word line drivers. The decoding circuitry is configured to receive address information and generate a set of word line control signals. The word line drivers couple to the decoding circuitry and are responsive to the word line control signals. Each word line driver is configured to provide pull-up drive capability, and can further be configured to provide pull-down drive capability. Each word line couples to at least one word line driver. The word line pull-down driver(s) couples to the word lines, with each word line pull-down driver being configured to provide pull-down drive capability. One or more word line pull-down drivers can be distributed (i.e., uniformly) along the length of each word line. The word lines can also be implemented using a hierarchical word line architecture that includes a set of main word lines (i.e., fabricated on a metal layer) and a set of segmented word lines (i.e., fabricated on a polysilicon layer) coupled to each main word line.

22 Claims, 4 Drawing Sheets

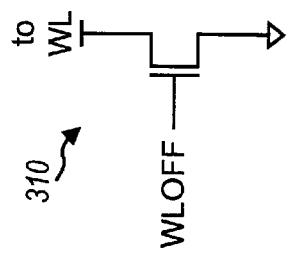
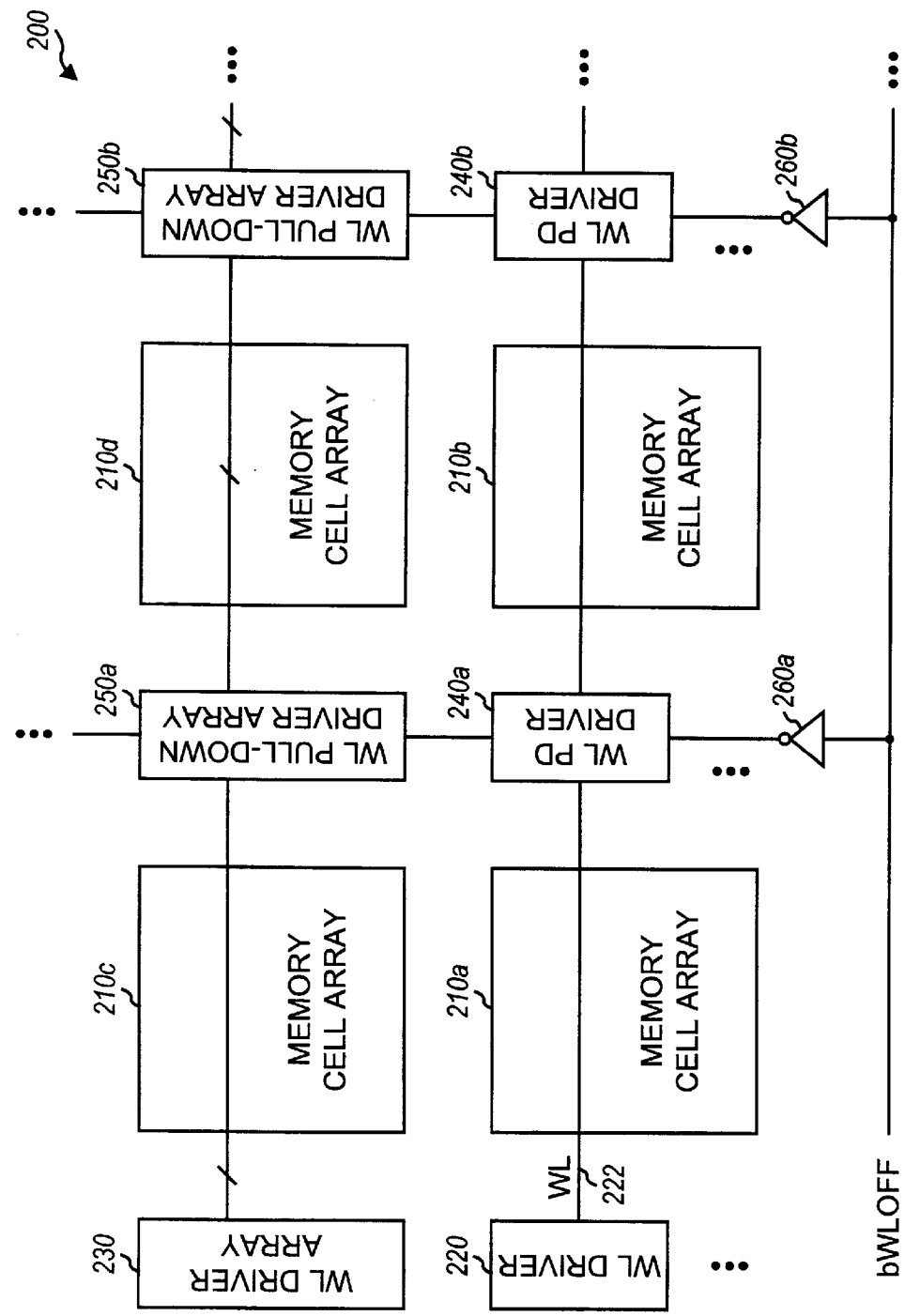
FIG. 7
FIG. 6

6,144,610

DISTRIBUTED CIRCUITS TO TURN OFF WORD LINES IN A MEMORY ARRAY

BACKGROUND OF THE INVENTION

The present invention relates generally to memory devices, and more particularly to distributed circuits to "turn off" word lines in a memory array.

Memory devices are integral to a computer system and to many electronic circuits. Continuous improvements in the operating speed and computing power of a central processing unit (CPU) enable operation of an ever-greater variety of applications, many of which require faster and larger memories. Larger memories can be obtained by shrinking the geometry of the memory cells and the data/control lines within the memory devices.

Smaller circuit geometry and increased integration in memory devices present various design issues. For example, reduction in the width (or pitch) of the control lines (e.g., word lines) results in higher line resistance. Narrow line pitch is especially problematic because the word lines are conventionally fabricated on a polysilicon layer that exhibits higher resistance than other materials such as metals. Thus, for a word line driver of a particular size, the higher line resistance increases the charge and discharge times of the line, which cause a corresponding increase in the access time of the memory cells within the memory device. In addition, with increased integration density, the number of memory cells coupled to each word line increases. As a result, the word line drive circuit may be required to have a larger current driving capability, which typically corresponds to larger die area and higher power dissipation, both of which are undesirable.

To address these design issues, some memory architectures employ a hierarchical word line structure having main word lines and split sub (or segmented) word lines. The segmented word lines are typically fabricated on a polysilicon layer and have relatively higher resistance. The main word lines are less resistive conductive lines, and are typically fabricated as on a metal layer. Further, each main word line is typically fabricated over and along an associated set of segmented word lines. The main word line is stitched, at various locations along the length of the main word line, to each associated segmented word line. This "metal strapping" reduces the resistance of the word line, which reduces the propagation delays through the word line and improves access time.

Examples of hierarchical word line structures in memory devices are described in U.S. Pat. No. 5,148,401, issued to Sekino et al., U.S. Pat. No. 5,812,483 issued to Jeon et al., U.S. Pat. No. 5,835,439 issued to Suh, and U.S. Pat. No. 5,875,149 issued to Oh et al. These patents are incorporated herein by reference.

As can be seen, memory architectures that decrease the charge or discharge time of word lines with minimal increase in circuit size and power consumption are highly desirable.

SUMMARY OF THE INVENTION

The invention provides word line architectures having faster discharge time and reduced propagation delay, which can lead to improved access time of memory cells in a memory device. The advantages are obtained by the use of one or more word line pull-down drivers that couple to the word lines and provide improved discharge time when the word lines are deactivated. The word line pull-down drivers can be configured in various manners and can be control using various schemes, as described below.

An embodiment of the invention provides a memory device that includes a row decoder, a set of word lines, and one or more word line pull-down drivers. The row decoder includes decoding circuitry and a set of word line drivers. The decoding circuitry is configured to receive address information and generate a set of word line control signals. The word line drivers couple to the decoding circuitry and are responsive to the word line control signals. Each word line couples to at least one word line driver. The word line driver is configured to provide pull-up drive capability, and can further be configured to provide pull-down drive capability. The word line pull-down driver(s) couples to the word lines, with each word line pull-down driver being configured to provide pull-down drive capability. For improved performance, the word line pull-down driver(s) are located away from the word line drivers.

Various designs can be implemented. For example, one or more word line pull-down drivers can be distributed (i.e., uniformly) along the length of each word line. The word lines can also be implemented using a hierarchical word line architecture that includes a set of main word lines (i.e., fabricated on a metal layer) and a set of segmented word lines (i.e., fabricated on a polysilicon layer) coupled to each main word line.

Another embodiment of the invention provides a memory device that includes a number of memory cell arrays, a row decoder, a column decoder, a set of word lines, a set of column select lines (CSLs), and a number of word line pull-down drivers. The row decoder includes row decoding circuitry and a set of word line drivers coupled to the row decoding circuitry. The column decoder includes column decoding circuitry and a set of CSL drivers coupled to the column decoding circuitry. Each word line couples to at least one word line driver and each CSL couples to at least one CSL driver. The word line pull-down drivers couple to the word lines (or CSLs), with each word line pull-down driver being configured to provide pull-down drive capability.

The foregoing, together with other aspects of this invention, will become more apparent when referring to the following specification, claims, and accompanying drawings.

BRIEF DESCRIPTION OF THE DRAWINGS

FIG. 6 shows a diagram of a partial layout of an embodiment of a memory device that includes the word line pull-down drivers of the invention.

FIG. 7 shows a diagram of an embodiment of a word line pull-down driver.

DESCRIPTION OF THE SPECIFIC EMBODIMENTS

For clarity, the invention is described for a specific implementation of a memory device. However, the specific details are intended to be illustrative, and not limitations, of the present invention. It will be recognized that alternative implementations of the invention and modifications of the architectures described herein can be made (i.e., to satisfy a particular design requirement), and these variations are all within the scope of the invention.

Figure 1:
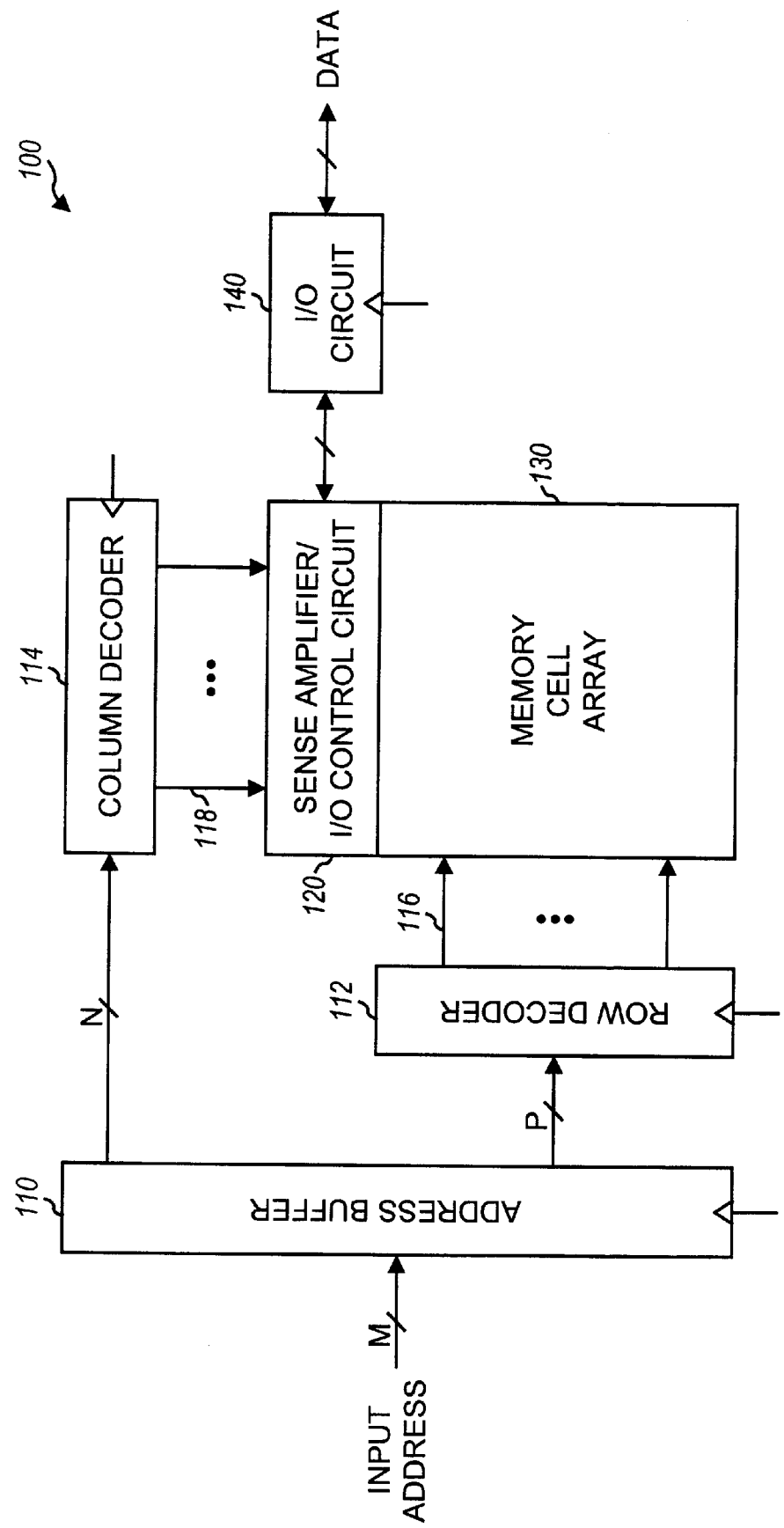
FIG. 1 shows a simplified diagram of an embodiment of a memory device.

FIG. 1 shows a simplified diagram of an embodiment of a memory device 100. As shown in FIG. 1, memory device 100 includes an address buffer 110 for receiving an input address and providing buffered address information to a row decoder 112 and a column decoder 114. Row decoder 112 activates one of a number of row control lines (or word lines) 116 for the selected memory cell(s), as determined by the address information received from buffer 110. In some memory array architectures, row decoder 112 may select a subset (i.e., two or more) of word lines to allow concurrent access to multiple memory cells.

Similarly, column decoder 114 activates one of a number of column select lines (CSLs) 118 for the selected memory cell(s), as determined by the address information received from buffer 110. CSLs 118 couple to a sense amplifier and input/output (I/O) control circuit 120 that further couples to a memory cell array 130 and an I/O circuit 140. Circuit 120 provides the signal conditioning and drive for the signals to and from memory cell array 130. Circuit 120 further provides the control and signal buffering for the signals to and from I/O circuit 140. The clock and timing circuitry that generates the clocks and timing signals is not shown in FIG. 1 for simplicity.

Memory cell array 130 includes memory cells for many data bits. The memory cells are typically arranged in a two-dimensional array. Word line 116 from row decoder 112 selects a particular row within memory cell array 130, and CSL 118 from column decoder 114 selects a particular column. In a specific embodiment, each memory cell array 130 includes 512 columns and 512 word lines (plus some redundant columns and word lines). Typically, one CSL is provided for one or more bit lines (BL). The selected word line and CSL are activated in accordance with the address provided to address buffer 110 by a source external or internal to the memory device.

For simplicity, FIG. 1 shows only one memory cell array 130. Generally, a memory device includes more than one memory cell array, which may be arranged into a number of memory blocks. Each memory block can include any number of memory cell arrays. As an example, a memory device can be a 64-Mbit DRAM device having four memory array blocks, with each memory array block including sixteen memory cell arrays, whereby each memory cell array includes 1 Mbits of memory. As another example, a memory device can be a 256-Mbit DRAM device having eight memory array blocks, with each memory array block including sixteen memory cell arrays, whereby each memory cell array includes 2 Mbits of memory.

Figure 2:
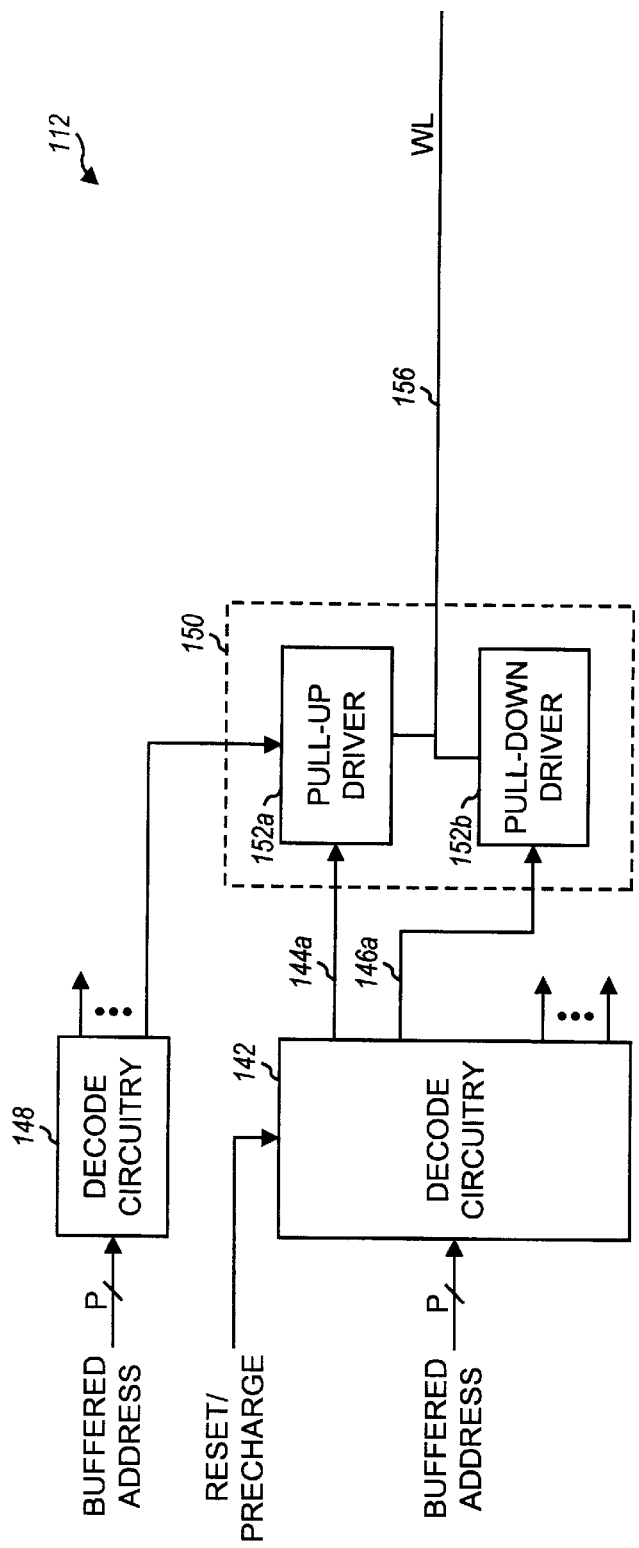
FIG. 2 shows a diagram of a portion of a row decoder.

FIG. 2 shows a diagram of a portion of row decoder 112. Within row decoder 112, the buffered address from address buffer 110 is provided to a decode circuitry 142 and a decode circuitry 148. Decode circuitry 142 may also receive additional input control signals such as a reset/precharge signal. Based on the input address and control signals, decode circuitry 142 activates word line control signals 144 and 146 for one or more word line drivers 150 (only one word line driver is shown in FIG. 2) that drive the selected word line(s). Decode circuitry 148 also couples to word line driver 150 and provides additional decoding for the word line pull-up drivers within word line drivers 150.

Within word line driver 150, a pull-up driver 152a and a pull-down driver 154a receive word line control signals 144a and 146a, respectively, from decode circuitry 142. Pull-up driver 152a pulls up a word line 156 (i.e., toward a high voltage or logic high) and pull-down driver 154a pulls down the word line (i.e., toward ground or logic low). Pull-up driver 152a and pull-down driver 154a can be implemented with a single field-effect-transistor (FET) as described in the aforementioned patents.

The circuitry for row decoder 112 for all memory arrays is typically located together in one area of the memory device, and often at one end of the word lines. The row decoding circuitry may include circuitry to decode address information to determine which row or rows to activate, drivers for driving the word lines high or low, and circuitry to reset the decoding circuitry when deactivating (i.e., turning off) the row.

Each word line has resistive and capacitive characteristics that vary along the length of the line. Thus, by driving from one end of the word line, the RC characteristics of the line affect the propagation delay through the line, which can limit the rate at which the word line can be switched.

Figure 3:
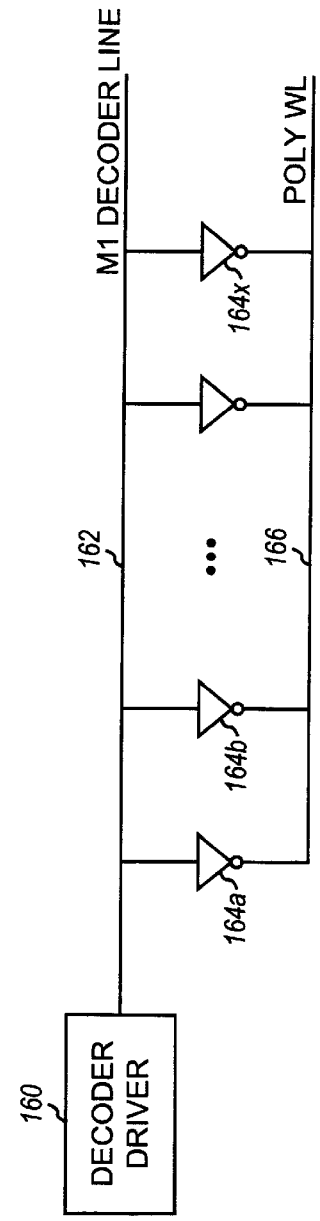
FIG. 3 shows a diagram of a distributed word line architecture.

FIG. 3 shows a diagram of a distributed word line architecture. A decoder driver 160 drives a decoder line 162 that couples to a number of word line drivers 164. Each word line driver 164 further couples to a word line 166. Typically, decoder line 162 is a metal layer line and word line 166 is a polysilicon layer line. The metal layer line exhibits less resistance, which can lead to improve access time. However, the distributed word line drivers 164 in this architecture occupy additional die area, consume additional power, and require a longer portion for the polysilicon layer line.

Figure 4:
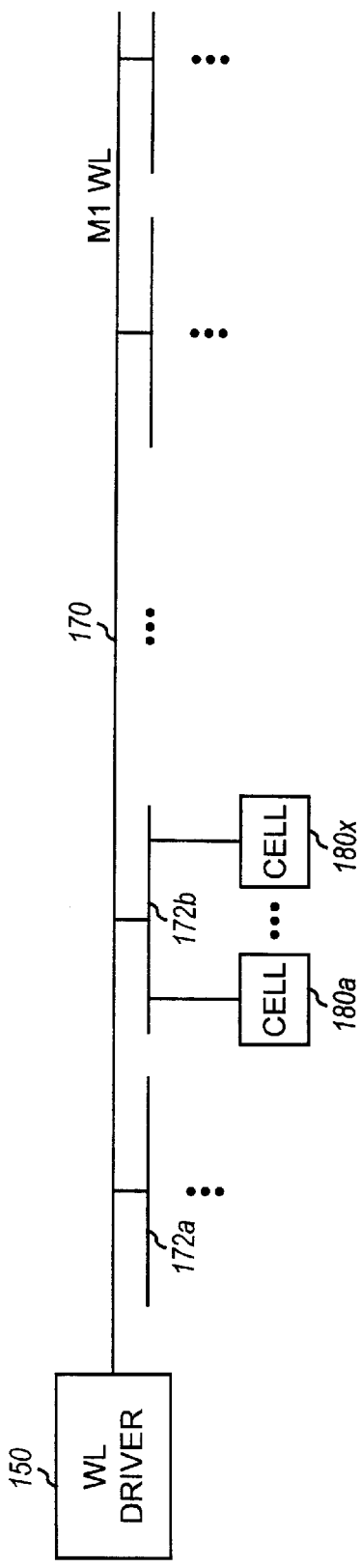
FIG. 4 shows a diagram of a hierarchical word line architecture.

FIG. 4 shows a diagram of a hierarchical word line architecture. Word line driver 150 couples to a main word line 170 that is typically implemented as a metal layer line. Main word line 170 traverses a portion (or possibly the entire length) of the memory array. At various locations (i.e., regular intervals) along the line, word line 170 is stitched to segmented word lines 172. Each segmented word line 172 couples to a set of memory cells 180 within a particular section of the memory cell array.

The hierarchical word line architecture shown in FIG. 4 provides several advantages. First, main word line 170 is typically a metal layer line having lower resistance than a polysilicon layer line, thereby improving the charge and discharge times, propagation delay, and access time. Moreover, segmented word lines 170 can be used as additional control lines to select multiple memory cells during an access cycle.

Figure 5:
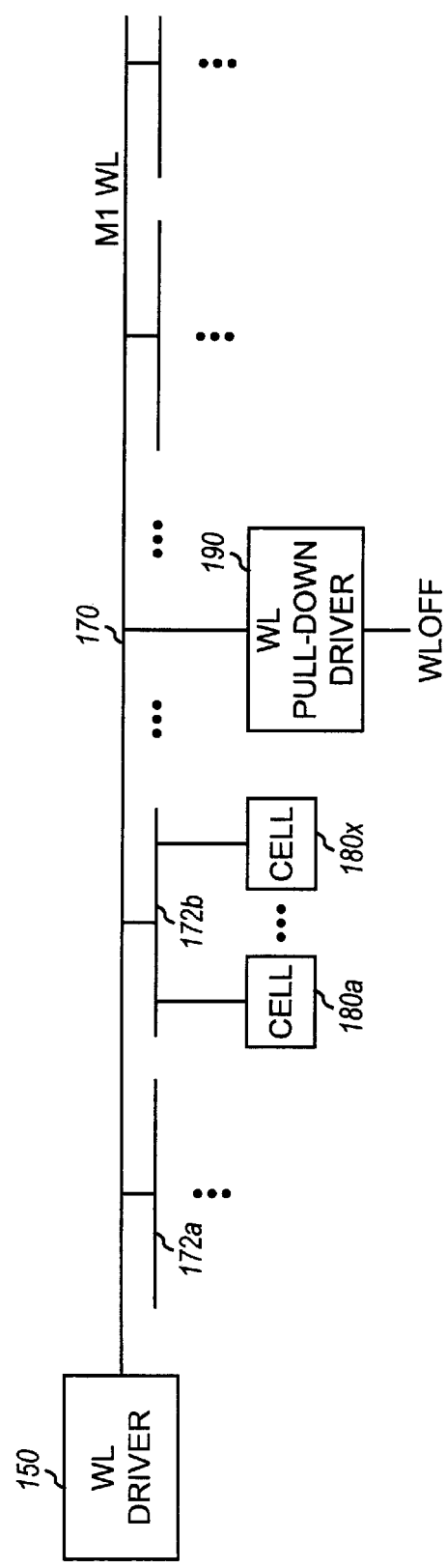
FIG. 5 shows a diagram of a hierarchical word line architecture that incorporates a word line pull-down driver to improve the discharge time of a word line.

FIG. 5 shows a diagram of a hierarchical word line architecture that incorporates a word line pull-down driver 190 to improve the discharge time of a word line. The architecture in FIG. 5 resembles that of FIG. 4, and includes word line driver 150 coupled to main word line 170 that stitches to a number of segmented word lines 172. The architecture in FIG. 5 further includes one or more word line pull-down drivers 190 (only one is shown in FIG. 5) located along main word line 170. In an embodiment, driver 190 is configured to pull the word line low (i.e., "turn off" the word line) when activated by a WLOFF control signal. In another embodiment, driver 190 is configured to pull the word line high (i.e., "turn on" the word line) when activated.

In many row decoder implementations, the control signals used to drive (or "turn on") the selected word lines are decoded (i.e., from the address information) and the control signals used to "turn off" the word lines are not decoded.

Referring back to FIG. 2, control signal 144a that activates pull-up driver 152a is decoded, and control signal 146a that activates pull-down driver 154a is typically not decoded. Thus, one pull-up control signal is often provided for each word line driver 150 (in particular, each pull-up driver 152a) and the pull-down control signal is shared by the pull-down drivers 154a. Accordingly, in an embodiment, a common or "universal" (i.e., WLOFF) control signal is provided to turn off the word lines in the memory device. In an embodiment, this universal control signal is not decoded.

Word line pull-down driver 190 can be located at various locations along word line 170. For example, in an embodiment in which one word line driver 150 is provided to drive the word line from one end, word line pull-down driver 190 can be located toward the opposite end of the word line, away from the word line driver. In an embodiment in which two word line drivers are provided to drive a word line from both ends, word line pull-down driver 190 can be located near the center of the word line. Generally, since each word line driver typically also includes a pull-down driver (i.e., pull-down driver 154a in FIG. 2), the word line pull-down drivers are located away from the word line drivers.

Multiple word line pull-down drivers 190 can also be provided for each word line. In an embodiment, the word line pull-down drivers are distributed (i.e., uniformly) along the word line. In another embodiment, the word line pull-down drivers are placed at locations along the word line according to the characteristics of the line. For example, the word line pull-down drivers can be placed near more resistive or capacitive sections of the word line.

FIG. 6 shows a diagram of a partial layout of an embodiment of a memory device 200 that includes the word line pull-down drivers of the invention. Memory device 200 includes a number of memory cell arrays 210 arranged in a grid-like pattern. Each row of memory cell arrays 210 includes a number of word line drivers 220, each driving a word line 222 that traverses a length of the memory device. The word line drivers for a particular row of memory cell arrays collectively form a word line driver array 230.

In the embodiment shown in FIG. 6, each word line 222 couples to a set of word line pull-down drivers 240 distributed along the word line. In particular, word line pull-down driver 240a is located between memory cell arrays 210a and 210b, word line pull-down driver 240b is located between memory cell array 210b and the next adjacent memory cell array, and so on. The word line pull-down drivers at a particular location collectively form a word line pull-down driver array 250.

As shown in FIG. 6, the word line pull-down drivers are controlled by a universal (bWLOFF) control signal that is provided to a number of inverting buffers 260. Each buffer 260 provides a control signal (i.e., an inverted bWLOFF or WLOFF control signal) that drives a column of word line pull-down drivers. In another embodiment, the word line pull-down drivers associated with each row of memory cell arrays are controlled by a separate row pull-down control signal. In this embodiment, the word line pull-down drivers associated with memory cell arrays 210a, 210b, and so on, are controlled by a first row pull-down control signal, the word line pull-down drivers associated with memory cell arrays 210c, 210d, and so on, are controlled by a second row pull-down control signal, and so on. In yet another embodiment, the word line pull-down drivers associated with each column of memory cell arrays are controlled by a separate column pull-down control signal. In this embodiment, the word line pull-down drivers associated with memory cell arrays 210a, 210c, and so on, are controlled by a first column pull-down control signal, the word line pull-down drivers associated with memory cell arrays 210b, 210d, and so on, are controlled by a second column pull-down control signal, and so on. Other schemes for distributing and controlling the word line pull-down drivers can be contemplated by those skilled in the art and are within the scope of the invention.

FIG. 7 shows a diagram of an embodiment of a word line pull-down driver. As shown in FIG. 7, word line pull-down driver is implemented with a single FET transistor, with the source grounded, the gate coupled to the WLOFF control signal, and the drain coupled to the word line. Other implementations of the word line pull-down driver can be designed by those skilled in the art and are within the scope of the invention.

The word line pull-down drivers provide advantages over conventional memory architectures that do not include these drivers. In particular, the word line pull-down drivers can improve the minimum row cycle time of the memory device, which is determined, in part, by the charge and discharge times of the word lines. The minimum row cycle time is determined by both the charge and discharge times. Typically, the word lines are first turned off (i.e., discharged) and the selected word line(s) is then turned on (i.e., charged). By improving the discharge time, higher row cycle rates can be obtained.

The word line pull-down drivers are also relatively simple to implement and do not require much additional die area. As shown in FIG. 7, each word line pull-down driver can be implemented with a single FET. Moreover, only one common (or few) control signal is needed to activate the word line pull-down drivers. The control signal can be implemented in a manner similar to the word lines or the CSLs.

Although the invention is described for a specific embodiment, alternative implementations of the invention and modifications of the architectures described herein can be made. For example, each column (or row) of word line pull-down drivers can be controlled by a separate column (or row) pull-down control signal. Further, one or more word line pull-down drivers can be coupled to each word line. Moreover, the word line pull-down drivers can be coupled to word lines implemented as polysilicon or metal layer lines. The word line pull-down drivers can also be designed to pull-up the word lines, instead of pulling down the word lines. More generally, the word line pull-down drivers (or more descriptively labeled as alternate word line drivers) can be designed to provide a drive capability opposite that of the word line drivers. Thus, the specific implementation details are intended to be illustrative, and not limitations, of the present invention.

The architectures described herein can be implemented within a standalone integrated circuit (IC) such as, for example, a dynamic random access memory (DRAM) IC, a synchronous graphics RAM (SGRAM), and other memory devices. The memory arrays can also be implemented within other ICs, such as a processor, a controller, a digital signal processor, an application specific integrated circuit (ASIC), and others. The memory architectures described herein can be implemented on a memory array that is embedded within an integrated circuit such as, for example, central processing unit (CPU).

The foregoing description of the specific embodiments is provided to enable any person skilled in the art to make or use the invention. Various modifications to these embodiments will be readily apparent to those skilled in the art, and the generic principles defined herein may be applied to other embodiments without the use of the inventive faculty. Thus, the invention is not intended to be limited to the embodiments shown herein but is to be accorded the widest scope consistent with the principles and novel features disclosed herein, and as defined by the following claims.

What is claimed is:

1. A memory unit comprising:
    a row decoder that includes
        decoding circuitry configured to receive address information and generate a set of word line control signals, and
        a set of word line drivers coupled to the decoding circuitry and responsive to the word line control signals, wherein each word line driver is configured to provide at least pull-up drive capability;
    a set of word lines, each word line coupled to at least one word line driver; and
    at least one word line pull-down driver coupled to the set of word lines and located away from the word line drivers, each word line pull-down driver configured to provide additional pull-down drive capability for the word line to which it couples.

2. The memory unit of claim 1 wherein the at least one word line pull-down driver is controlled by a common control signal.

3. The memory unit of claim 1 wherein each word line is associated with a set of one or more word line pull-down drivers that are distributed along a length of the word line.

4. The memory unit of claim 3 wherein the set of one or more word line pull-down drivers associated with each word line is uniformly distributed along the length of the word line.

5. The memory unit of claim 3 wherein the word line drivers are located at one end of the word lines, and wherein the one or more word line pull-down drivers are located away from the word line drivers.

6. The memory unit of claim 1 wherein each word line pull-down driver is implemented with a common-source field-effect-transistor.

7. The memory unit of claim 1 further comprising:
    at least one memory cell array coupled to the set of word lines.

8. The memory unit of claim 1 wherein one word line driver couples to one end of each word line and one or more word line pull-down drivers further couple to the word line.

9. The memory unit of claim 1 wherein the set of word lines is implemented using a hierarchical architecture that comprises
    a set of main word lines; and
    a set of segmented word lines coupled to each main word line.

10. The memory unit of claim 9 wherein the main word lines are fabricated as metal layer lines and the segmented word lines are implemented as polysilicon layer lines.

11. The memory unit of claim 9 wherein, for each word line, a word line pull-down driver is coupled to the word line at a location between each adjacent pair of segmented word lines that couple to the word line.

12. A dynamic random access memory (DRAM) device comprising the memory unit of claim 1.

13. A synchronous graphics random access memory (SGRAM) device comprising the memory unit of claim 1.

14. An embedded memory integrated circuit comprising the memory unit of claim 1.

15. A memory unit comprising:
    a row decoder that includes
        decoding circuitry configured to receive address information and generate a set of word line control signals, and
        a set of word line drivers coupled to the decoding circuitry and responsive to the word line control signals, wherein each word line driver is configured to provide at least pull-up drive capability;
        a set of word lines implemented using a hierarchical architecture and including
            a set of main word lines fabricated as metal layer lines, and
            a set of segmented word lines coupled to each main word line and fabricated as polysilicon layer lines, and
        wherein each main word line coupled to at least one word line driver; and
    at least one word line pull-down driver coupled to the set of word lines and located away from the word line drivers, each word line pull-down driver configured to provide additional pull-down drive capability for the word line to which it couples.

16. A memory unit comprising:
    a row decoder that includes
        decoding circuitry configured to receive address information and generate a set of word line control signals, and
        a set of word line drivers coupled to the decoding circuitry and responsive to the word line control signals, wherein each word line driver is configured to provide either pull-up or pull-down drive capability, or both;
    a set of word lines, each word line coupled to at least one word line driver; and
    at least one alternate word line driver coupled to the set of word lines and located away from the word line drivers, each alternate word line driver configured to provide additional pull-up or pull-down drive capability for the word line to which it couples.

17. A memory unit comprising:
    a plurality of memory cell arrays;
    a row decoder that includes
        row decoding circuitry, and
        a set of word line drivers coupled to the row decoding circuitry;
    a column decoder that includes
        column decoding circuitry, and
        a set of column select line (CSL) drivers coupled to the column decoding circuitry;
    a set of word lines, each word line coupled to at least one word line driver;
    a set of CSLs, each CSL coupled to at least one CSL driver;
    a plurality of word line pull-down drivers coupled to the set of word lines and located away from the word line drivers, each word line pull-down driver configured to provide additional pull-down drive capability for the word line to which it couples.

18. The memory unit of claim 17 wherein the plurality of word line pull-down drivers is controlled by a common control signal.

19. The memory unit of claim 17 wherein word line pull-down drivers associated with each row of memory cell arrays are controlled by a row control signal.

20. The memory unit of claim 17 wherein word line pull-down drivers associated with each column of memory cell arrays are controlled by a column control signal.

21. The memory unit of claim 17 wherein each word line pull-down driver is implemented with a common-source field-effect-transistor.

22. The memory unit of claim 17 wherein the set of word lines is implemented using a hierarchical architecture and comprises a set of main word lines; and a set of segmented word lines coupled to each main word line.

* * * * *